(12) United States Patent
Sleight et al.

(10) Patent No.: US 12,166,106 B2
(45) Date of Patent: Dec. 10, 2024

(54) GRAPHENE/NANOSTRUCTURE FET WITH SELF-ALIGNED CONTACT AND GATE

(71) Applicant: International Business Machines Corporation, Armonk, NY (US)

(72) Inventors: Jeffrey W. Sleight, Ridgefield, CT (US); Josephine Chang, Bedford Hills, NY (US); Isaac Lauer, Chappaqua, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 253 days.

(21) Appl. No.: 17/542,566

(22) Filed: Dec. 6, 2021

(65) Prior Publication Data

US 2022/0093772 A1   Mar. 24, 2022

Related U.S. Application Data

(60) Continuation of application No. 13/570,275, filed on Aug. 9, 2012, now abandoned, which is a division of
(Continued)

(51) Int. Cl.
  *H01L 29/66* (2006.01)
  *B82Y 10/00* (2011.01)
  (Continued)

(52) U.S. Cl.
  CPC ........ *H01L 29/66628* (2013.01); *B82Y 10/00* (2013.01); *H01L 21/76897* (2013.01);
  (Continued)

(58) Field of Classification Search
  CPC ......... H01L 29/66628; H01L 21/76897; H01L 29/0665; H01L 29/0669; H01L 29/66742;
  (Continued)

(56) References Cited

U.S. PATENT DOCUMENTS

| 4,824,796 A | 4/1989 | Chiu et al. |
| 5,612,240 A | 3/1997 | Chang |

(Continued)

FOREIGN PATENT DOCUMENTS

| CN | 1845341 A | 10/2006 |
| CN | 101099248 A | 1/2008 |

(Continued)

OTHER PUBLICATIONS

Javey et al., Self-Aligned 40nm Channel Carbon Nanotube Field-Effect Transistors With Subthreshold Swings Down to 70mV/decade, Quantum Sensing and Nanophotonic Devices II, 2005, pp. 14-18, vol. 5732, Proceedings of SPIE.
(Continued)

Primary Examiner — Khaja Ahmad
Assistant Examiner — Sun Mi Kim King
(74) Attorney, Agent, or Firm — Cantor Colburn LLP; Kimberly Zillig

(57) ABSTRACT

A field effect transistor (FET) includes a substrate; a channel material located on the substrate, the channel material comprising one of graphene or a nanostructure; a gate located on a first portion of the channel material; and a contact aligned to the gate, the contact comprising one of a metal silicide, a metal carbide, and a metal, the contact being located over a source region and a drain region of the FET, the source region and the drain region comprising a second portion of the channel material.

18 Claims, 10 Drawing Sheets

Related U.S. Application Data application No. 12/820,341, filed on Jun. 22, 2010, now Pat. No. 9,368,599.

(51) Int. Cl.
  *H01L 21/768* (2006.01)
  *H01L 29/06* (2006.01)
  *H01L 29/786* (2006.01)
  *H10K 10/46* (2023.01)
  *H10K 85/20* (2023.01)

(52) U.S. Cl.
  CPC ...... *H01L 29/0665* (2013.01); *H01L 29/0669* (2013.01); *H01L 29/66742* (2013.01); *H01L 29/78684* (2013.01); *H10K 10/46* (2023.02); *H10K 85/221* (2023.02)

(58) Field of Classification Search
  CPC ........... H01L 29/78684; H01L 29/1606; H01L 29/778; B82Y 10/00; H10K 10/46; H10K 85/221
  See application file for complete search history.

(56) References Cited

U.S. PATENT DOCUMENTS

| | | | |
|---|---|---|---|
| 6,114,209 A | 9/2000 | Chu et al. | |
| 6,184,119 B1 | 2/2001 | Ku et al. | |
| 7,172,954 B2 | 2/2007 | Hierlemann | |
| 7,262,991 B2 | 8/2007 | Zhang et al. | |
| 7,534,675 B2 | 5/2009 | Bangsaruntip et al. | |
| 7,598,516 B2 | 10/2009 | Avouris et al. | |
| 7,704,806 B2 | 4/2010 | Chae et al. | |
| 8,039,870 B2 | 10/2011 | Burke et al. | |
| 2001/0045606 A1 | 11/2001 | Kanamori | |
| 2005/0087824 A1 | 4/2005 | Cabral, Jr. et al. | |
| 2005/0212014 A1 | 9/2005 | Horibe et al. | |
| 2006/0151844 A1* | 7/2006 | Avouris ............... | H10K 10/464 257/411 |
| 2006/0220074 A1 | 10/2006 | Datta et al. | |
| 2006/0226424 A1 | 10/2006 | Chae et al. | |
| 2007/0068300 A1 | 3/2007 | Wu et al. | |
| 2007/0069300 A1 | 3/2007 | Cheng et al. | |
| 2007/0296052 A1 | 12/2007 | Lee et al. | |
| 2008/0128760 A1 | 6/2008 | Jun et al. | |
| 2008/0151603 A1 | 6/2008 | Radosavljevic et al. | |
| 2008/0173864 A1* | 7/2008 | Fujita .................. | H10K 10/464 257/E51.04 |
| 2008/0296562 A1 | 12/2008 | Murduck et al. | |
| 2008/0315183 A1 | 12/2008 | Kinoshita et al. | |
| 2009/0020764 A1* | 1/2009 | Anderson ............. | H01L 29/785 257/77 |
| 2009/0032804 A1 | 2/2009 | Kalburge | |
| 2009/0072223 A1 | 3/2009 | Awano | |
| 2009/0114903 A1* | 5/2009 | Kalburge ............... | B82Y 10/00 977/762 |
| 2009/0155963 A1 | 6/2009 | Hawkins et al. | |
| 2009/0224230 A1 | 9/2009 | Pesetski et al. | |
| 2009/0236675 A1 | 9/2009 | Yang et al. | |
| 2009/0291538 A1 | 11/2009 | Mise et al. | |
| 2010/0038627 A1 | 2/2010 | Parikh et al. | |
| 2010/0051960 A1 | 3/2010 | Chen et al. | |
| 2010/0252810 A1 | 10/2010 | Fuller et al. | |
| 2011/0114914 A1 | 5/2011 | Numata et al. | |
| 2011/0136304 A1 | 6/2011 | Wong et al. | |
| 2012/0298949 A1 | 11/2012 | Chang et al. | |

FOREIGN PATENT DOCUMENTS

| | | |
|---|---|---|
| CN | 102893381 A | 1/2013 |
| DE | 102005018533 A1 | 10/2006 |
| DE | 60313462 T2 | 1/2008 |
| DE | 112011100901 T5 | 1/2013 |
| GB | 2494017 A | 2/2013 |
| JP | 2008205272 A | 9/2008 |
| TW | 201214578 A | 4/2012 |
| WO | 2009018395 A2 | 2/2009 |
| WO | 2009023348 A2 | 2/2009 |
| WO | 2010010766 A1 | 1/2010 |

OTHER PUBLICATIONS

Li et al., Design, Fabrication and Characterization of High-Performance Silicon Nanowire Transistors, 8th IEEE Conference on Nanotechnology, 2008, pp. 526-529, IEEE.

Martel et al., "Ambipolar Electrical Transport in Semiconducting Single-Wall Carbon Nanotubes", Physical Review Letters, vol. 87, No. 25, 256805, Dec. 17, 2001.

Quirk, et al., "Semiconductor Manufacturing Technology", Prentice Hall, Upper Saddle, NY, 2001, pp. 465.

Zhang et al., Self-Aligned Ballistic n-Type Single-Walled Carbon Nanotube Field-Effect Transistors with Adjustable Threshold Voltage, Nano Letters, 2008, pp. 3696-3701, vol. 8, No. 11, American Chemical Society.

* cited by examiner

100

---

DEPOSIT CHANNEL MATERIAL; FORM GATE AND SPACERS ON CHANNEL MATERIAL
101

DEPOSIT CONTACT MATERIAL OVER CHANNEL MATERIAL, GATE AND SPACERS
102

DEPOSIT DIELECTRIC MATERIAL OVER CONTACT MATERIAL
103

REMOVE DIELECTRIC MATERIAL AND CONTACT MATERIAL TO EXPOSE TOP OF GATE
104

RECESS CONTACT MATERIAL
105

REMOVE DIELECTRIC MATERIAL
106

PATTERN CONTACT MATERIAL TO FORM FET
107

GRAPHENE/NANOSTRUCTURE FET WITH SELF-ALIGNED CONTACT AND GATE

FIELD

This disclosure relates generally to the field of field effect transistor (FET) fabrication, and in particular to graphene-based FET fabrication.

DESCRIPTION OF RELATED ART

Graphene refers to a two-dimensional planar sheet of carbon atoms arranged in a hexagonal benzene-ring structure. A free-standing graphene structure is theoretically stable only in a two-dimensional space, which implies that a truly planar graphene structure does not exist in a three-dimensional space, being unstable with respect to formation of curved structures such as soot, fullerenes, nanotubes or buckled two dimensional structures. However, a two-dimensional graphene structure may be stable when supported on a substrate, for example, on the surface of a silicon carbide (SiC) crystal. Free standing graphene films have also been produced, but they may not have the idealized flat geometry.

Structurally, graphene has hybrid orbitals formed by $sp^2$ hybridization. In the $sp^2$ hybridization, the 2s orbital and two of the three 2p orbitals mix to form three $sp^2$ orbitals. The one remaining p-orbital forms a pi ($\pi$)-bond between the carbon atoms. Similar to the structure of benzene, the structure of graphene has a conjugated ring of the p-orbitals, i.e., the graphene structure is aromatic. Unlike other allotropes of carbon such as diamond, amorphous carbon, carbon nanofoam, or fullerenes, graphene is only one atomic layer thin.

Graphene has an unusual band structure in which conical electron and hole pockets meet only at the K-points of the Brillouin zone in momentum space. The energy of the charge carriers, i.e., electrons or holes, has a linear dependence on the momentum of the carriers. As a consequence, the carriers behave as relativistic Dirac-Fermions with a zero effective mass and are governed by Dirac's equation. Graphene sheets may have a large carrier mobility of greater than 200,000 $cm^2$/V-sec at 4K. Even at 300K, the carrier mobility can be as high as 15,000 $cm^2$/V-sec.

Graphene layers may be grown by solid-state graphitization, i.e., by sublimating silicon atoms from a surface of a silicon carbide crystal, such as the (0001) surface. At about 1,150° C., a complex pattern of surface reconstruction begins to appear at an initial stage of graphitization. Typically, a higher temperature is needed to form a graphene layer. Graphene layers on another material are also known in the art. For example, single or several layers of graphene may be formed on a metal surface, such as copper and nickel, by chemical deposition of carbon atoms from a carbon-rich precursor.

Graphene displays many other advantageous electrical properties such as electronic coherence at near room temperature and quantum interference effects. Ballistic transport properties in small scale structures are also expected in graphene layers.

While single-layer graphene sheet has a zero band-gap with linear energy-momentum relation for carriers, two-layer graphene, i.e. bi-layer graphene, exhibits drastically different electronic properties, in which a band gap may be created under special conditions. In a bi-layer graphene, two graphene sheets are stacked on each other with a normal stacking distance of roughly 3.35 angstrom, and the second layer is rotated with respect to the first layer by 60 degree. This stacking structure is the so-called A-B Bernel stacking, and is also the graphene structure found in natural graphite. Similar to single-layer graphene, bi-layer graphene has zero-band gap in its natural state. However, by subjecting the bi-layer graphene to an electric field, a charge imbalance can be induced between the two layers, and this will lead to a different band structure with a band gap proportional to the charge imbalance.

A field effect transistor (FET) may be fabricated using graphene, graphite, which comprises stacked sheets of graphene, or nanostructures formed from graphene such as carbon nanotubes, for the FET channel and source/drain regions. Alternately, the FET may be formed using nanowires made of a semiconducting material for the FET channel and source/drain regions. The source/drain regions of the FET require electrical contacts, which may be formed using a contact material. The contacts to the source/drain regions in a graphene/nanostructure FET need to be formed using a contact material with a relatively low contact resistance, in order to obtain good FET operating characteristics.

SUMMARY

In one aspect, a field effect transistor (FET) includes a substrate; a channel material located on the substrate, the channel material comprising one of graphene or a nanostructure; a gate located on a first portion of the channel material; and a contact aligned to the gate, the contact comprising one of a metal silicide, a metal carbide, and a metal, the contact being located over a source region and a drain region of the FET, the source region and the drain region comprising a second portion of the channel material.

Additional features are realized through the techniques of the present exemplary embodiment. Other embodiments are described in detail herein and are considered a part of what is claimed. For a better understanding of the features of the exemplary embodiment, refer to the description and to the drawings.

BRIEF DESCRIPTION OF THE SEVERAL VIEWS OF THE DRAWINGS

Referring now to the drawings wherein like elements are numbered alike in the several FIGURES.

DETAILED DESCRIPTION

Embodiments of a graphene/nanostructure FET with a self-aligned contact and gate, and methods of forming a graphene/nanostructure FET with a self-aligned contact and gate, are provided, with exemplary embodiments being discussed below in detail. The channel and source/drain regions of the graphene/nanostructure FET include one or more sheets of graphene in some embodiments, or nanostructures, such as carbon nanotubes or semiconductor nanowires, in other embodiments. A relatively low-resistance contact that is self-aligned to the FET gate may be formed over the source/drain regions of the graphene/nanostructure FET. The contact may be formed from a material having a relatively low resistance, such as a metal, a silicide, or a carbide.

Figure 1:
FIG. 1 illustrates an embodiment of a method of fabricating a graphene/nanostructure FET with a self-aligned contact and gate.
Figure 1:
Figure 1:
Figure 1:
Figure 1:
Figure 1:
Figure 2A:
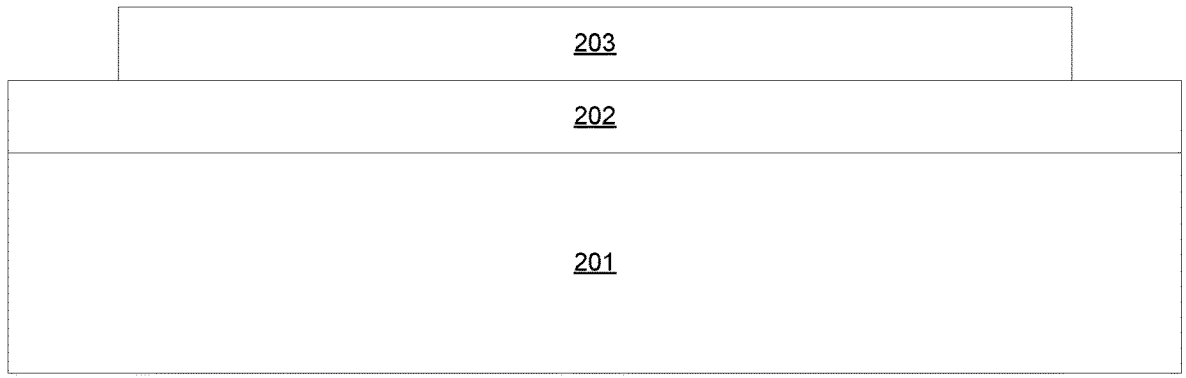
FIG. 2A illustrates an embodiment of a deposited channel material on a substrate.
Figure 2B:
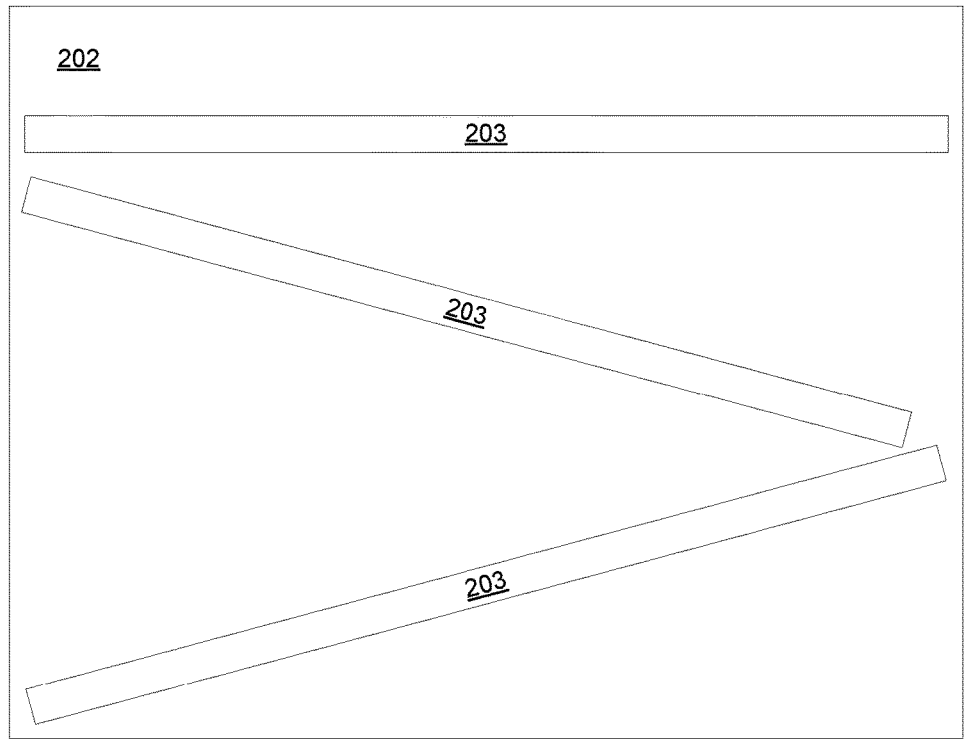
FIG. 2B illustrates a top view of an embodiment of a deposited channel material comprising nanostructures on a substrate.

FIG. 1 illustrates an embodiment of a method 100 of fabricating a graphene/nanostructure FET having a self-aligned contact and gate. FIG. 1 is discussed with reference to FIGS. 2-9. In block 101, a channel material 203 is deposited on a substrate. The substrate includes an insulating layer 202 located on a silicon substrate 201, as shown in FIG. 2A. Insulating layer 202 may comprise an oxide material such as silicon oxide ($SiO_2$) in some embodiments. Channel material 203 may be one or more sheets of graphene in some embodiments, or may include nanostructures, such as semiconductor nanowires or carbon nanotubes, in other embodiments. FIG. 2B illustrates an embodiment of a channel material 203 comprising nanostructures, such as carbon nanotubes or semiconductor nanowires, on the substrate. As shown in FIG. 2B, the nanostructure channel material 203 is formed on insulating layer 202.

Figure 3:
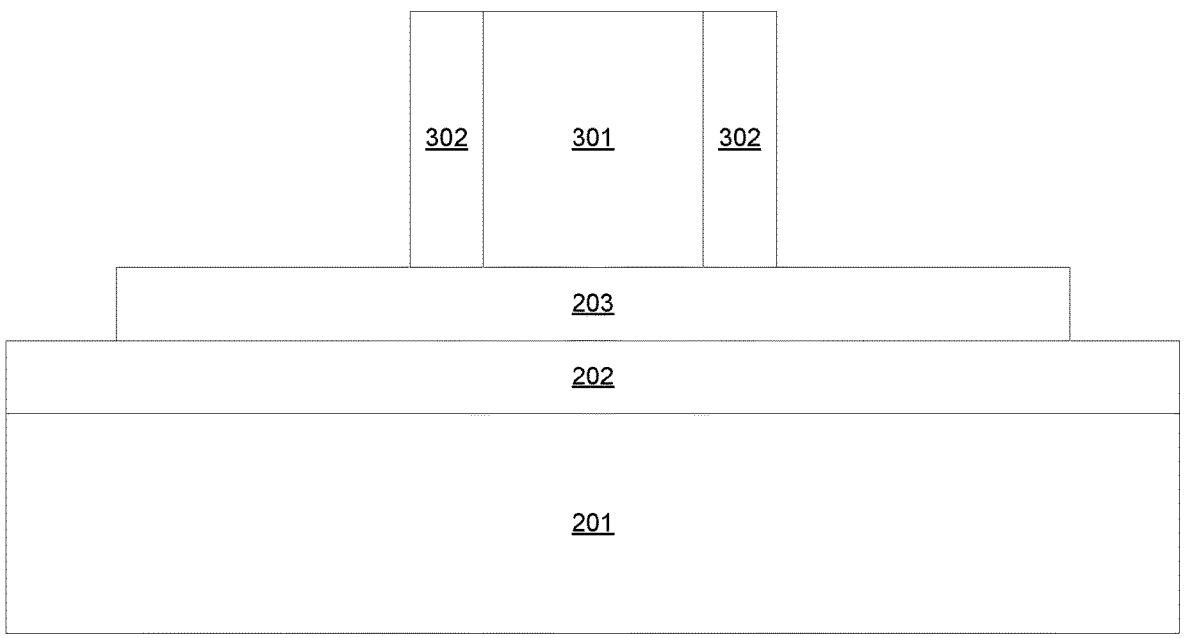
FIG. 3 illustrates an embodiment of the device of FIG. 2A after gate and spacer formation.

Gate 301 is then formed over the channel material 203, and sidewall spacers 302 are formed adjacent to gate 301 over channel material 203, as shown in FIG. 3. In some embodiments, gate 301 may be patterned from a stack of materials including a thin layer of a gate dielectric, such as hafnium oxide ($HfO_2$), and, on top of the thin layer of gate dielectric, a gate metal such as titanium nitride (TiN) or tungsten (W), and, optionally, on top of the gate metal, a gate hardmask, such as silicon nitride (SiN). Sidewall spacers 302 may comprise a nitride or an oxide in some embodiments, and may be formed by deposition of the spacer material and etching to form the sidewall spacers 302.

Figure 4:
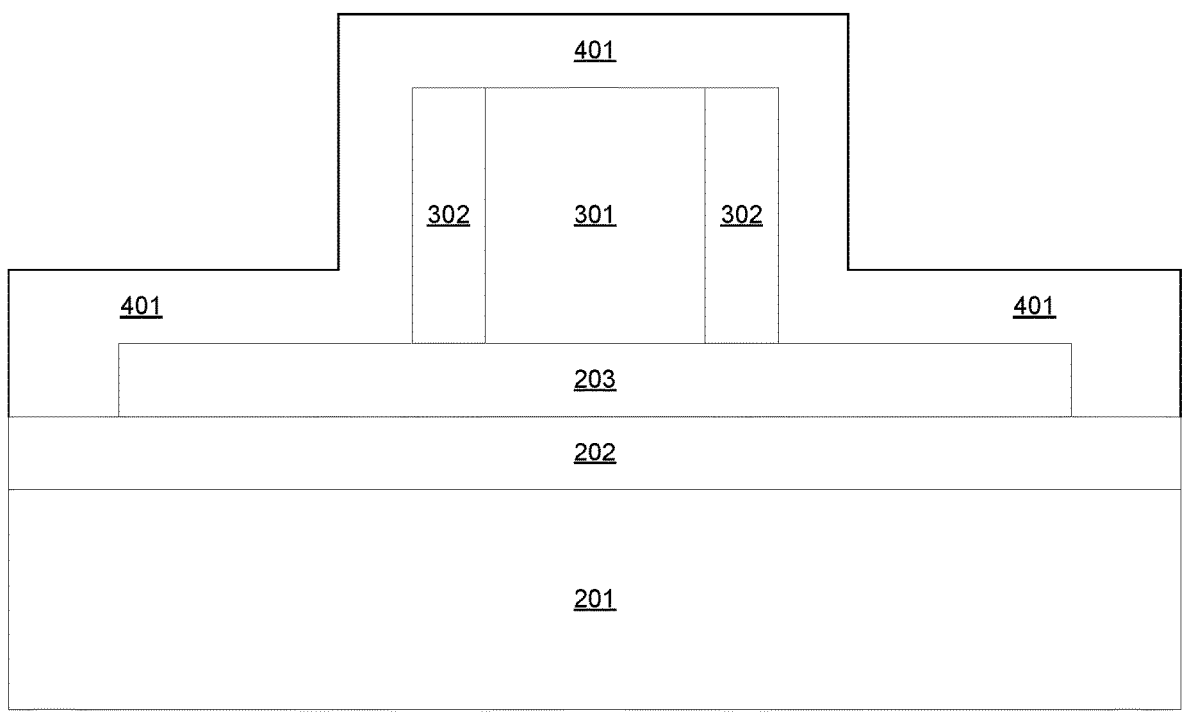
FIG. 4 illustrates an embodiment of the device of FIG. 3 after deposition of contact material.

In block 102, a contact material 401 is deposited over the device 300 of FIG. 3, resulting in the device 400 shown in FIG. 4. Contact material 401 may include a metal that has a relatively low resistance, or carbon or silicon in some embodiments.

Figure 5:
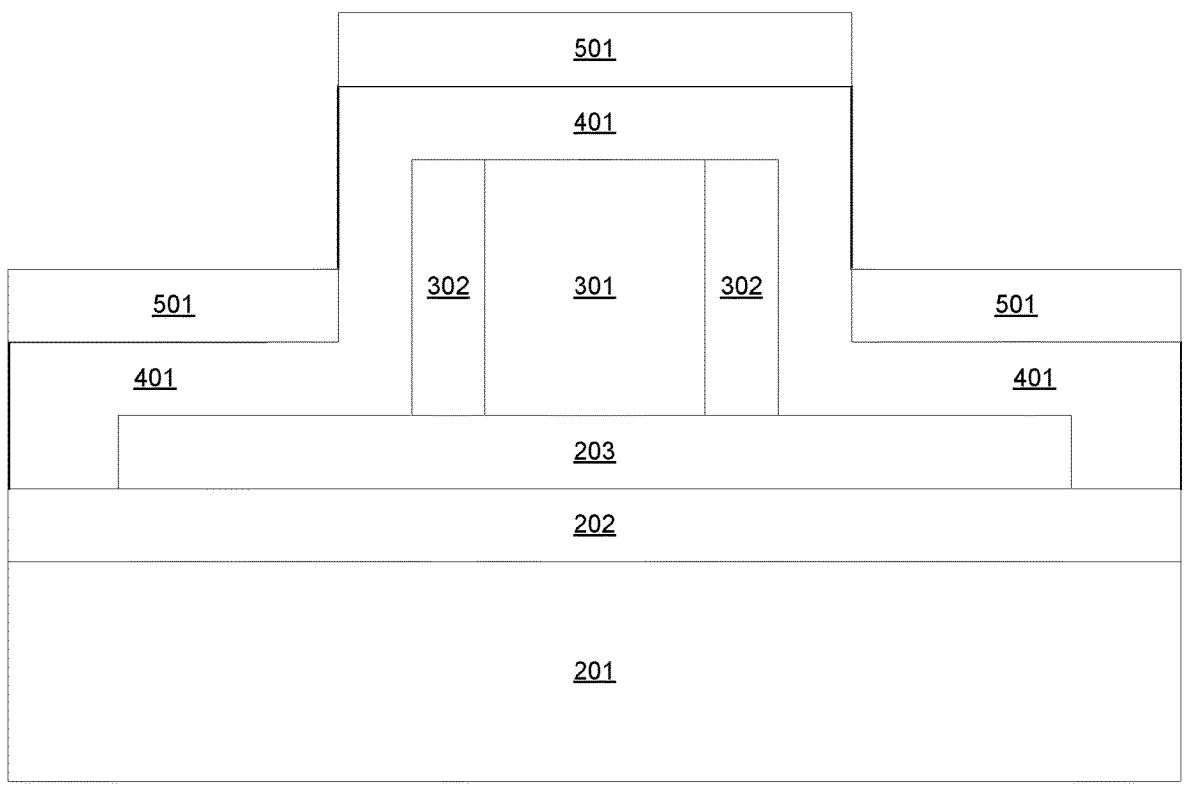
FIG. 5 illustrates an embodiment of the device of FIG. 4 after deposition of a dielectric material.

In block 103, a dielectric material 501 is deposited over contact material 401, as shown in FIG. 5. Deposition of dielectric material 501 may be directional in some embodiments, i.e., dielectric material does not form on the horizontal portions of contact material 401 on sidewall spacers 302, as shown in FIG. 5. In other embodiments, if deposition of dielectric material 501 is not directional, any portions of dielectric material 501 that is deposited on the horizontal portion of the contact material 401 on sidewall spacers 302 is be removed using, for example, a hydrofluoric wet etch, as shown in FIG. 5. Dielectric material 501 may be a material that chosen such that contact material 401 is removable without removing dielectric material 501; dielectric material 501 may include high density plasma (HDP) oxide in some embodiments.

Figure 6:
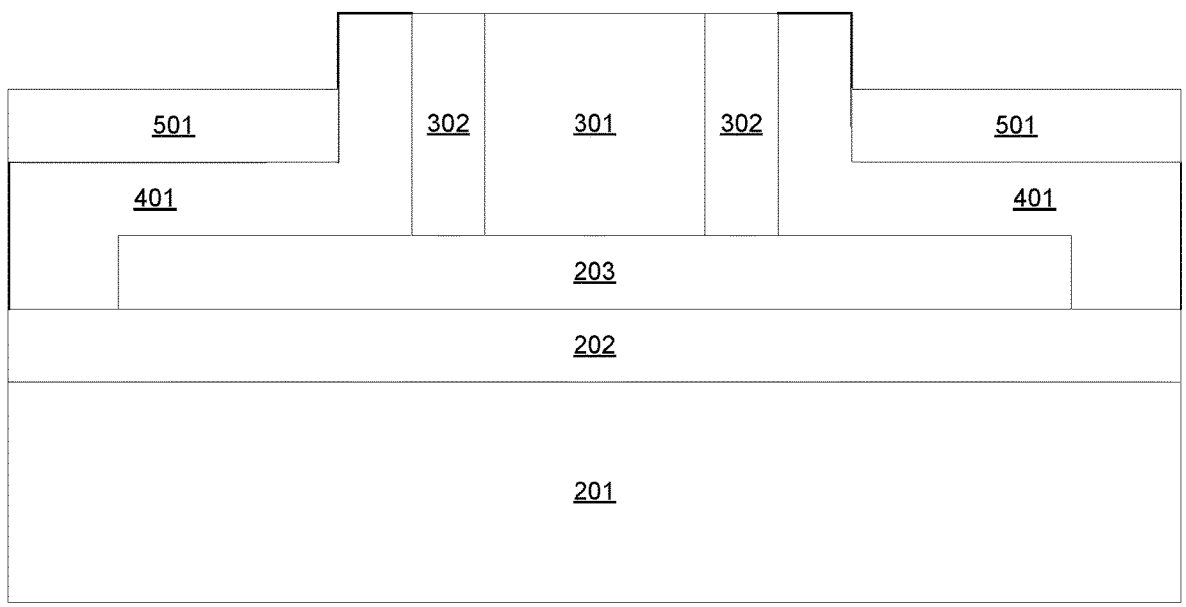
FIG. 6 illustrates an embodiment of the device of FIG. 5 after chemical mechanical polishing.
Figure 7:
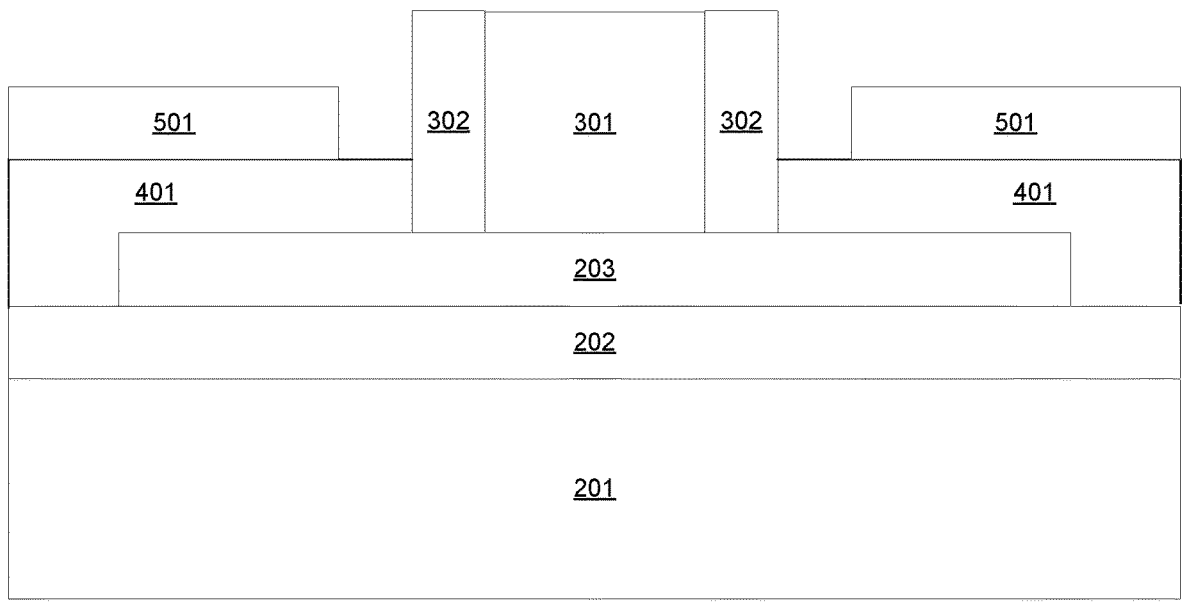
FIG. 7 illustrates an embodiment of the device of FIG. 6 after recessing the contact material.

In block 104, chemical mechanical polishing (CMP) is performed to remove the top portion of dielectric material 501 and contact material 401, exposing the top of gate 301, as is shown in FIG. 6. Then, in block 105, the contact material 401 located adjacent to sidewall spacers 302 is recessed below the level of dielectric material 501, as shown in FIG. 7. In embodiments in which contact material 401 includes carbon and dielectric material 501 includes HDP oxide, contact material 401 may be recessed using oxygen plasma. Use of oxygen plasma allows removal of contact material 401 without removing dielectric material 501 or sidewall spacers 302.

Figure 8:
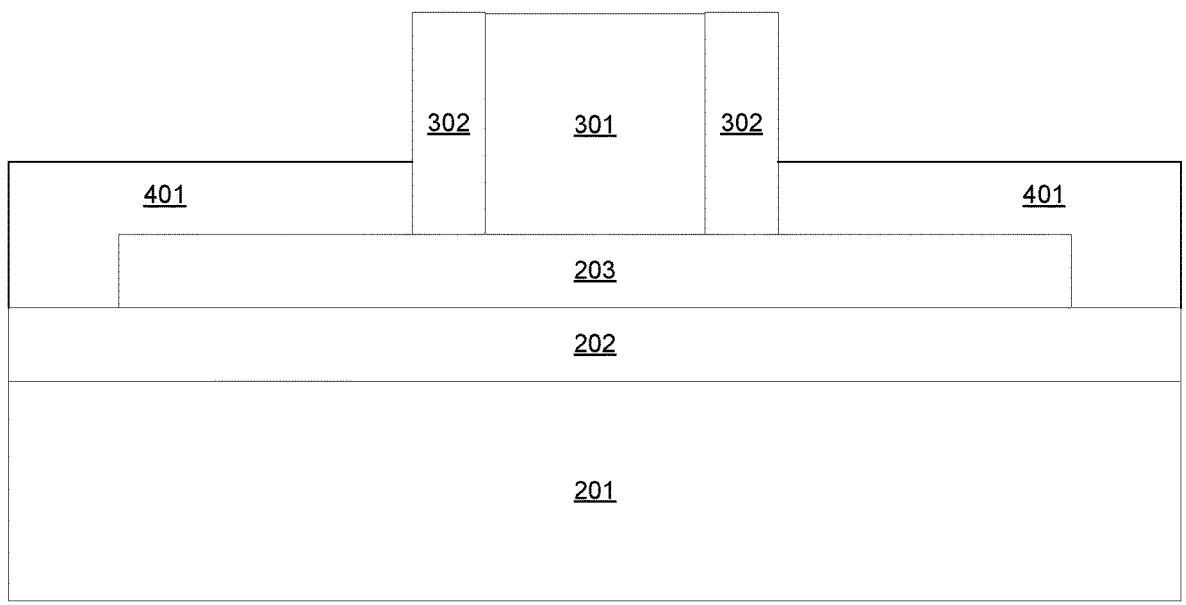
FIG. 8 illustrates an embodiment of the device of FIG. 7 after removal of the dielectric material.

In block 106, the dielectric material 501 is removed as shown in FIG. 8. Dielectric material 501 may be removed by any appropriate method. Then, in embodiments in which contact material 401 comprises carbon or silicon, the contact material may be converted to a metal carbide or a metal silicide in order to reduce the contact resistance of contact material 401. The conversion may be accomplished by depositing a layer of a complementary metal on contact material 401 and annealing the device with the deposited metal layer to a temperature that is higher than the formation temperature of the desired metal silicide or metal carbide that the metal reacts with the silicon or carbon contact material 401. The annealing causes contact material 401 to be converted into the metal silicide or metal carbide; all of contact material 401 may react with the deposited metal layer in some embodiments. Then, after the anneal, any remaining unreacted metal is removed selectively to the metal silicide or metal carbide.

Figure 9A:
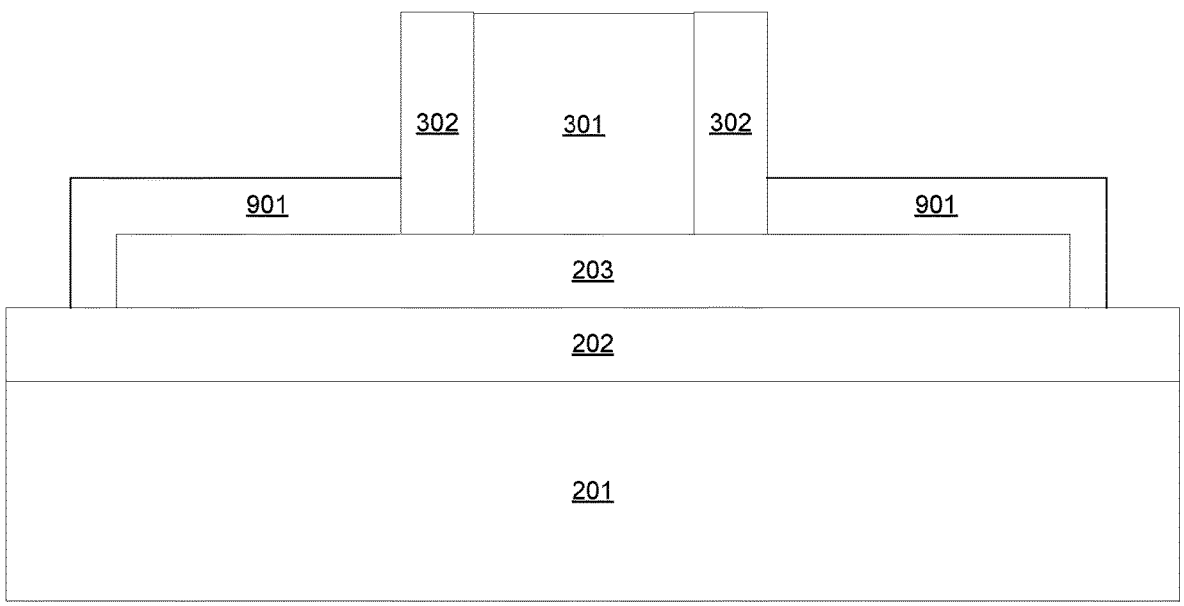
FIG. 9A illustrates an embodiment of a graphene/nanostructure FET with a self-aligned contact and gate after patterning the contact material.
Figure 9B:
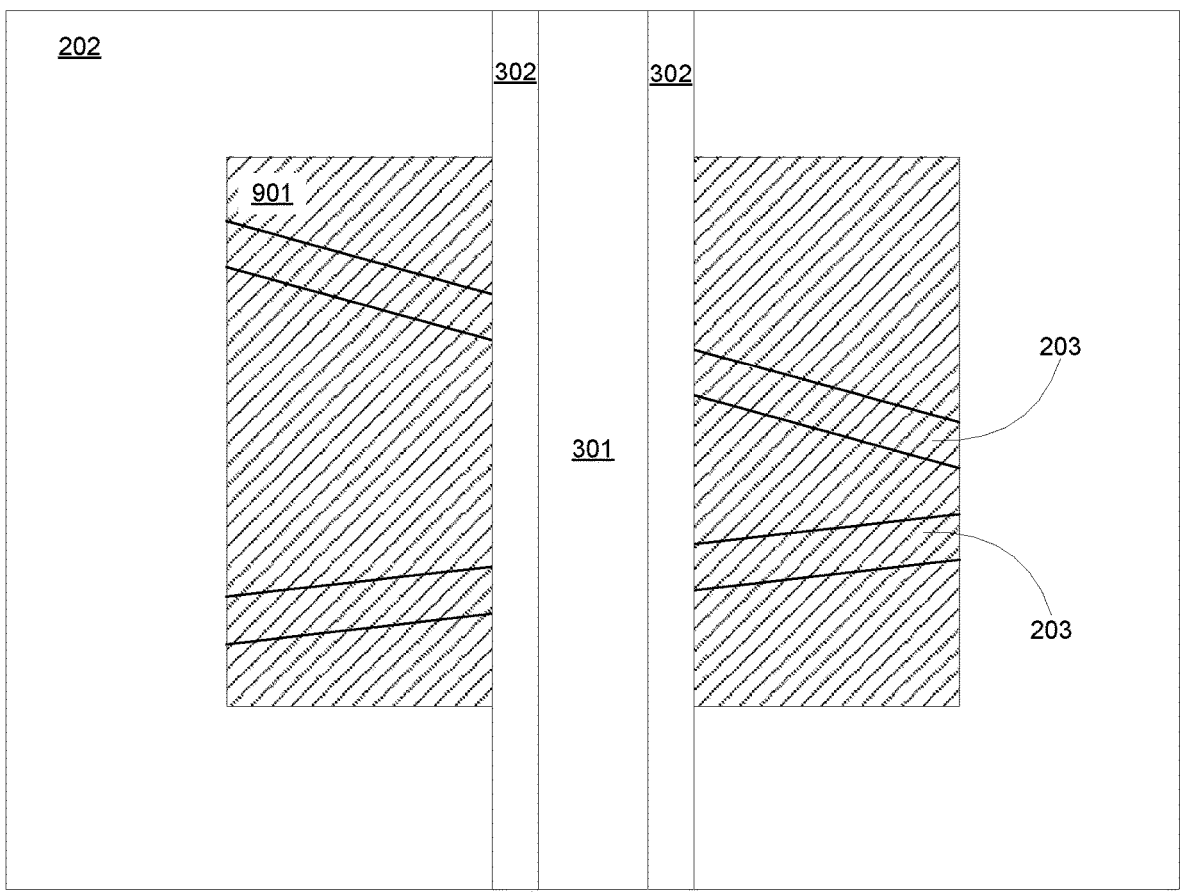
FIG. 9B illustrates a top view of an embodiment of a graphene/nanostructure FET with a self-aligned contact and gate comprising a nanostructure channel material.

In block 107, the contact material 401 is masked and patterned to remove any contact material 401 that is located on non-FET regions of the substrate, resulting in self-aligned contact 901 as shown in FIGS. 9A-B. FET 900A-B of FIGS. 9A-B has self-aligned contact 901 and gate 301 formed over channel material 203. Contact 901 is self-aligned to gate 301 and to the source and drain regions, and may comprise a metal, a carbide, or a silicide, having a relatively low contact resistance to the source and drain regions of the FET. Channel material 203 may include one or more sheets of graphene in some embodiments, or nanostructures such as carbon nanotubes or semiconductor nanowires in other embodiments. FIG. 9B illustrates a top view of an embodiment of a FET 900B showing contact 901 over channel material 203, in which channel material 203 includes nanostructures such as carbon nanotubes or semiconductor nanowires. The portion of channel material 203 located underneath gate 301 comprises the FET channel, and the portions of channel material 301 located underneath self-aligned contact 901 form the FET source and drain regions. Self-aligned contact 901 acts as an electrical contact for the source and drain regions of the FET during operation.

The technical effects and benefits of exemplary embodiments include a self-aligned method of forming a FET having a relatively low contact resistance.

The terminology used herein is for the purpose of describing particular embodiments only and is not intended to be limiting of the invention. As used herein, the singular forms "a", "an", and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

The invention claimed is:

1. A method comprising:
providing a field effect transistor (FET) comprising: a channel material on a substrate, the channel material comprising graphene, a gate located on a first portion of the channel material, and a contact aligned to the gate, the contact being located over a source region and a drain region of the FET, the source region and the drain region comprising a second portion of the channel material, an intervening layer being present between the channel material and the substrate;
wherein the contact comprises a metal carbide having been formed from a carbon material positioned on the source region and the drain region, forming the metal carbide further comprising depositing a complementary metal on top of the contact and annealing the complementary metal on the top of the contact to a temperature greater than that required for a formation of the metal carbide such that the complementary metal reacts with the contact to form the metal carbide;
wherein the metal carbide is formed above an unreacted part of the second portion of the channel material such that the metal carbide is in direct contact with both a sidewall of the channel material and a top surface of the intervening layer; and
wherein:
the metal carbide comprises a first bottom surface and a second bottom surface;
a spacer is adjacent to the gate such that the first bottom surface of the metal carbide is coplanar with a bottom surface of the gate; and
the second bottom surface of the metal carbide is coplanar with a bottom surface of the channel material.

2. The method of claim 1, further comprising:
removing any unreacted portions of the complementary metal; and
forming a spacer adjacent to the gate.

3. The method of claim 1, further comprising forming a spacer adjacent to the gate, the spacer comprising an oxide.

4. The method of claim 1, further comprising forming a spacer adjacent to the gate, the spacer comprising a nitride.

5. The method of claim 1, wherein the substrate comprises silicon.

6. The method of claim 1, wherein the intervening layer between the channel material and the substrate comprises an insulator.

7. The method of claim 1, wherein the intervening layer between the channel material and the substrate comprises an oxide layer.

8. The method of claim 1, wherein the gate comprises a gate dielectric layer, and a gate metal layer on top of the gate dielectric layer.

9. The method of claim 1, wherein the gate comprises a gate dielectric layer and a gate metal layer on top of the gate dielectric layer, the gate dielectric layer comprising hafnium oxide (HfO2), the gate metal layer comprising a material selected from the group consisting of titanium nitride (TiN) and tungsten (W).

10. A method comprising:
providing a field effect transistor (FET) comprising: a channel material on a substrate, the channel material comprising at least one carbon nanotube, a gate located on a first portion of the channel material, and a contact aligned to the gate, the contact being located over a source region and a drain region of the FET, the source region and the drain region comprising a second portion of the channel material, an intervening layer being present between the channel material and the substrate;
wherein the contact comprises a metal carbide having been formed from a carbon material positioned on the source region and the drain region, forming the metal carbide further comprising depositing a complementary metal on top of the contact and annealing the complementary metal on the top of the contact to a temperature greater than that required for a formation of the metal carbide such that the complementary metal reacts with the contact to form the metal carbide;
wherein the metal carbide is formed above an unreacted part of the second portion of the channel material such that the metal carbide is in direct contact with both a sidewall of the channel material and a top surface of the intervening layer; and
wherein:
the metal carbide comprises a first bottom surface and a second bottom surface;
a spacer is adjacent to the gate such that the first bottom surface of the metal carbide is coplanar with a bottom surface of the gate; and
the second bottom surface of the metal carbide is coplanar with a bottom surface of the channel material.

11. The method of claim 10, further comprising:
removing any unreacted portions of the complementary metal; and
forming a spacer adjacent to the gate.

12. The method of claim 10, further comprising forming a spacer adjacent to the gate, the spacer comprising an oxide.

13. The method of claim 10, further comprising forming a spacer adjacent to the gate, the spacer comprising a nitride.

14. The method of claim 10, wherein the substrate comprises silicon.

15. The method of claim 10, wherein the intervening layer between the channel material and the substrate comprises an insulator.

16. The method of claim 10, wherein the intervening layer between the channel material and the substrate comprises an oxide layer.

17. The method of claim 10, wherein the gate comprises a gate dielectric layer, and a gate metal layer on top of the gate dielectric layer.

18. The method of claim 10, wherein the gate comprises a gate dielectric layer and a gate metal layer on top of the gate dielectric layer, the gate dielectric layer comprising hafnium oxide (HfO2), the gate metal layer comprising a material selected from the group consisting of titanium nitride (TiN) and tungsten (W).

\* \* \* \* \*